United States Patent [19]

Bright et al.

[11] Patent Number: 4,498,725
[45] Date of Patent: Feb. 12, 1985

[54] ELECTRICAL CONNECTOR

[75] Inventors: Edward J. Bright, Elizabethtown; Gary R. Marpoe, Jr., Hummelstown, both of Pa.; Klaus D. Schuemann, Los Gatos, Calif.; Wilmer L. Sheesley, Dauphin, Pa.

[73] Assignee: AMP Incorporated, Harrisburg, Pa.

[21] Appl. No.: 619,641

[22] Filed: Jun. 14, 1984

Related U.S. Application Data

[63] Continuation of Ser. No. 384,359, Jun. 2, 1982, abandoned.

[51] Int. Cl.³ .................. H01R 11/22; H01R 13/629
[52] U.S. Cl. .......................... 339/176 M; 339/75 M; 339/258 R; 339/258 T
[58] Field of Search ............ 339/75 R, 75 M, 75 MP, 339/176 F, 176 M, 258 R, 258 T, 258 P

[56] References Cited

U.S. PATENT DOCUMENTS

| | | | |
|---|---|---|---|
| 2,982,883 | 5/1961 | Gordy | 339/75 MP X |
| 3,142,891 | 8/1964 | Travis | 339/258 R |
| 3,315,212 | 4/1967 | Peterson | 339/75 |
| 3,594,698 | 7/1971 | Anhalt | 339/75 M |
| 3,676,832 | 7/1972 | Judge et al. | 339/75 M |
| 3,763,459 | 10/1973 | Millis | 339/75 M |
| 3,858,153 | 12/1974 | Coller et al. | 339/258 R X |
| 3,915,537 | 10/1975 | Harris et al. | 339/64 R |
| 4,188,715 | 2/1980 | Ammon et al. | 339/176 M X |
| 4,343,524 | 10/1982 | Bright et al. | 339/74 R |

FOREIGN PATENT DOCUMENTS 147440 4/1981 German Democratic Rep. .................. 339/258 R

OTHER PUBLICATIONS

Catalogue Entitled "IC Sockets", published by Yamaichi Electronics, Co., Ltd. of Japan.

Primary Examiner—John McQuade
Assistant Examiner—Steven C. Bishop
Attorney, Agent, or Firm—Allan B. Osborne

[57] ABSTRACT

The invention disclosed herein relates to a contact element having upwardly extending, spaced apart arms capable of being twisted about a horizontal axis to provide torsional forces and converging fingers extending laterally from the arms to receive between the free ends a pin or lead from an electronic package or device to establish electrical contact therebetween. The free ends of the fingers, being spaced apart a distance less than the pin diameter or lead thickness, exert compressive forces against the pin or lead which, along with the torsional forces being exerted by the arms, provides an enhanced electrical contact.

2 Claims, 9 Drawing Figures

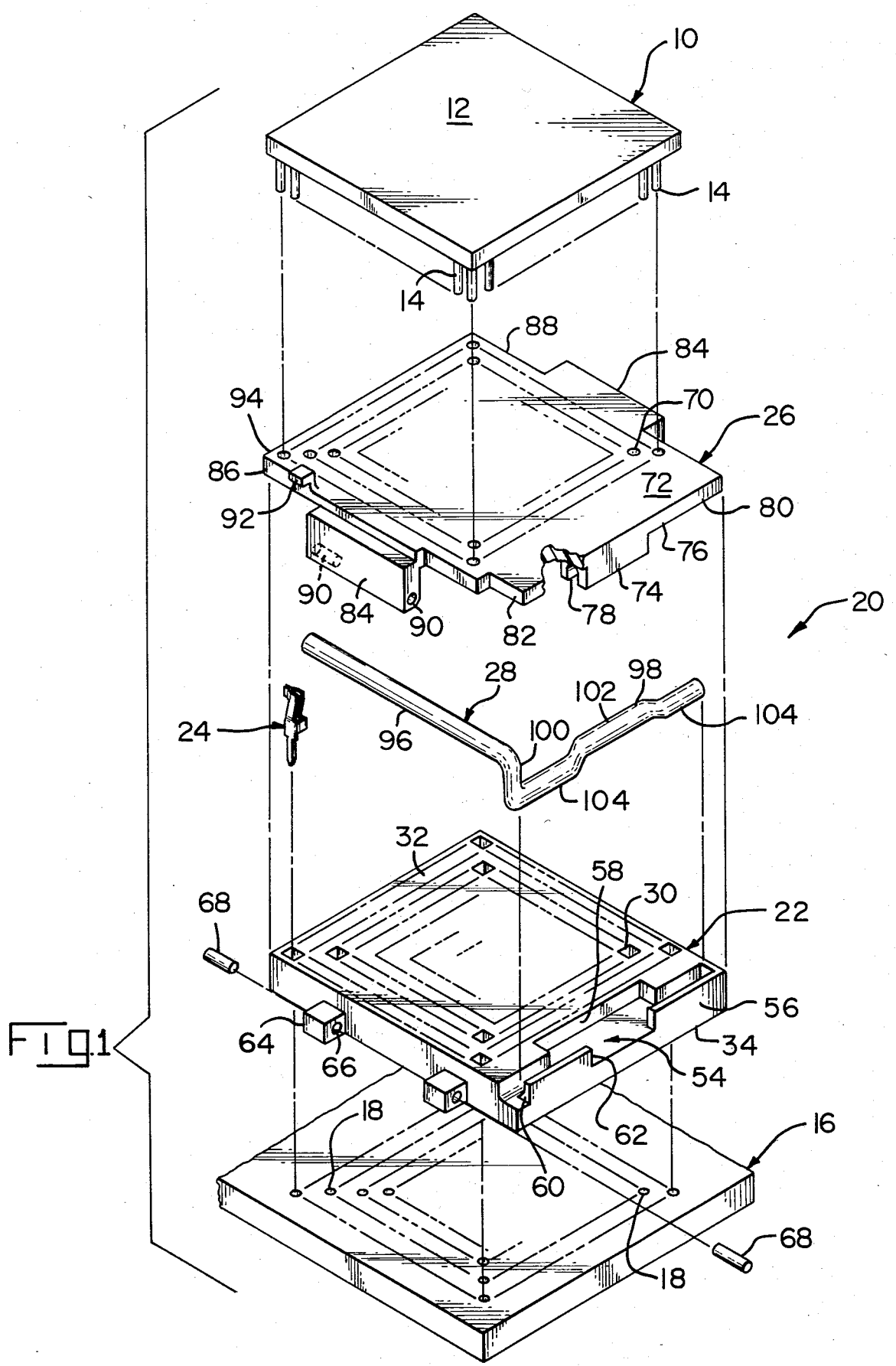

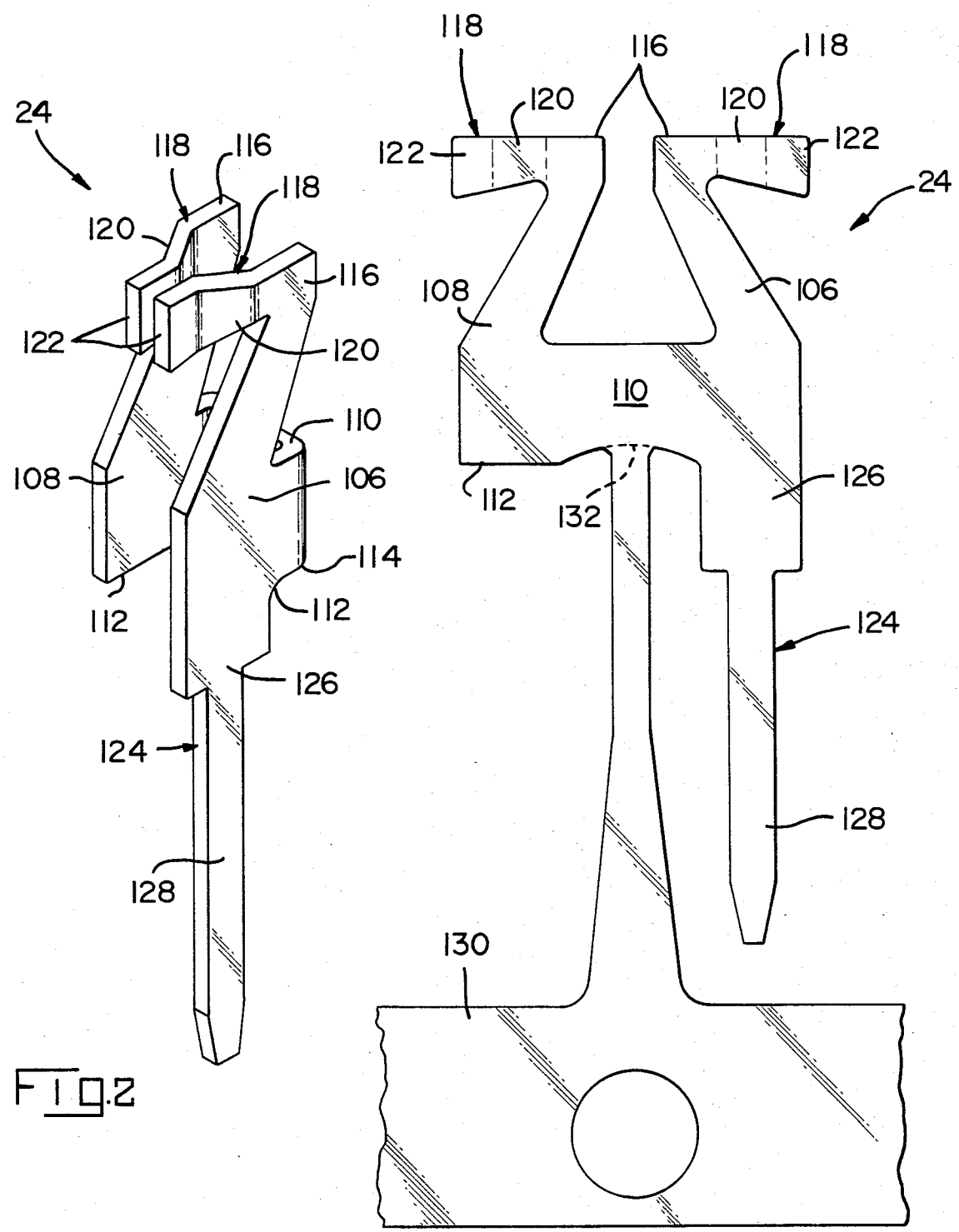

ELECTRICAL CONNECTOR

This application is a continuation of application Ser. No. 384,359 filed June 2, 1982, now abandoned.

There is described in U.S. Pat. No. 3,915,537 a zero or low insertion force, low actuation force connector or contact element for receiving pin grid substrate pins as well as other types of leads on electronic devices. This contact element comprises a bifurcated spring yoke having a pair of inwardly extending arms. Contact surfaces are provided on the arms on opposing faces. The pins or leads are either slid in between the arms from a side or from above. A beveled portion on the contact surfaces provide a zero insertion force when the pin is introduced into the contact element from the side. The shape of the contact surfaces and resiliency of the arms provide a low insertion force when the pin is inserted from above.

The contact elements may be housed in recesses in a base. The recesses have a length such that the pins can be first inserted into the recesses and then the substrate or other electronic package moved along the surface of the base to push the pins in between the arms and contact surfaces thereon.

The present invention is intended to provide a connector comprising a housing, a cover, and contact elements generally of the above kind. The cover, slidingly movable across the surface of the housing, provides support for the pins or leads being driven laterally in between the normally closed arms on the contact elements.

A connector as defined in the above paragraph is, according to the present invention, characterized in having a housing of insulated material with a plurality of cavities extending vertically therethrough, a cover having openings therethrough slidably mounted on the housing and a plurality of contact elements positioned in the cavities. The contact elements have a pair of parallel, spaced apart upwardly extending arms which are capable of being twisted about a vertical axis. Converging fingers extend laterally from the arms with the free ends of the fingers being spaced apart a distance less than the diameter of a pin or thickness of a lead which is to be inserted in between the free ends. Leads depend from the contact elements for insertion into a circuit board or the like; e.g., a back-plane panel.

The connector further includes a cover having a plurality of openings through which the pins or leads on an electronic device pass upon mounting such device on the connector. The pins or leads initially enter the cavities in between the spaced apart arms without contact so that there is no insertion force. Means on the connector move or slide the cover across the surface of the housing with the walls defining the openings pushing the pins or leads laterally in between the free ends on the fingers. As the free ends are forced apart, the arms twist and exert a torsional force which combine with the compressive forces being exerted by the forced apart free ends to create a high force bearing against the pins or leads to establish a superior electrical contact between the pins or leads and contact elements.

The state of the art is further exemplified by U.S. Pat. Nos. 3,763,459, 3,594,698, and 2,982,883.

For a better understanding of the invention, reference will now be made by way of example of the accompanying drawings in which:

FIG. 1 is an isometric view of a pin grid substrate, a printed circuit board and the ZIF (zero insertion force) connector of the present invention for electrically interconnecting the two;

FIG. 2 is an isometric view of a contact element forming a part of the connector of the present invention;

FIG. 3 is a blanked-out contact element of FIG. 2 prior to being formed;

Figure 4:
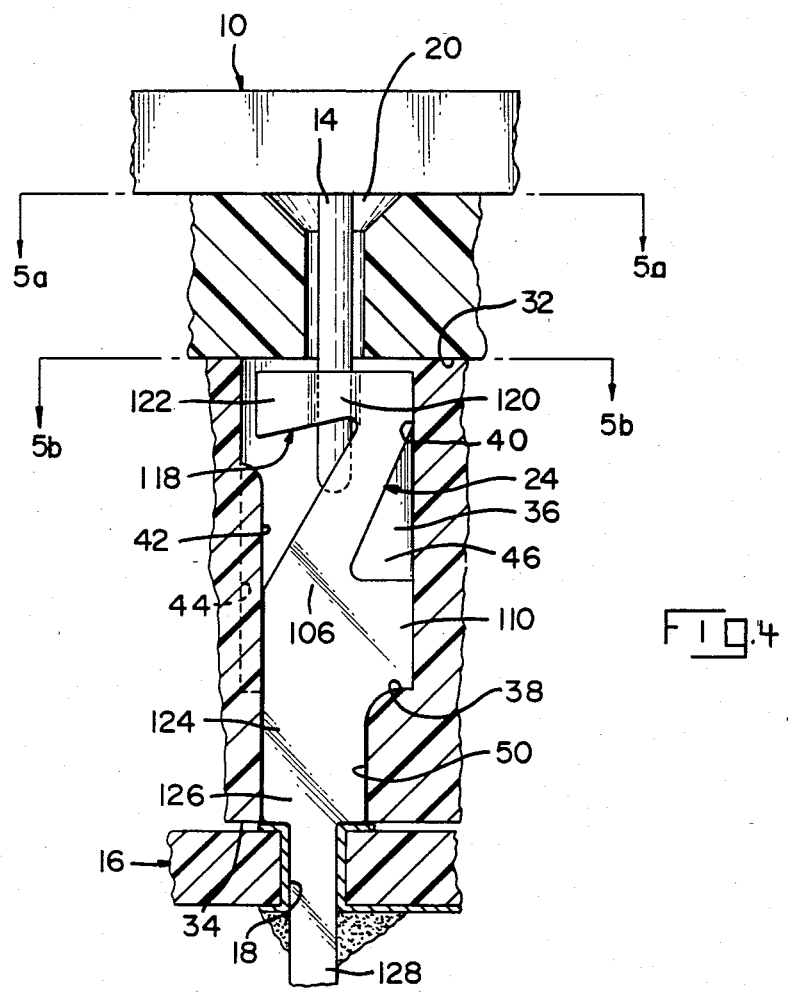
FIG. 4 is a cross-sectional view showing the contact element of FIG. 2 positioned in a cavity in the connector of FIG. 1 mounted on a circuit board and with a substrate on the connector with a pin extending into the cavity and between the two arms on the contact element.
Figure 5A:
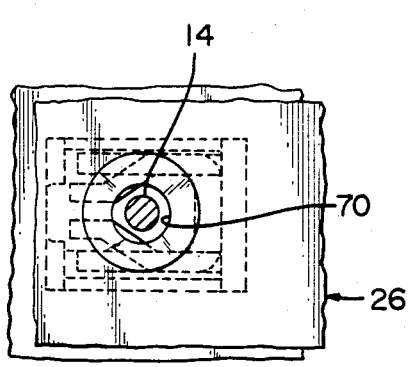
Figure 5B:
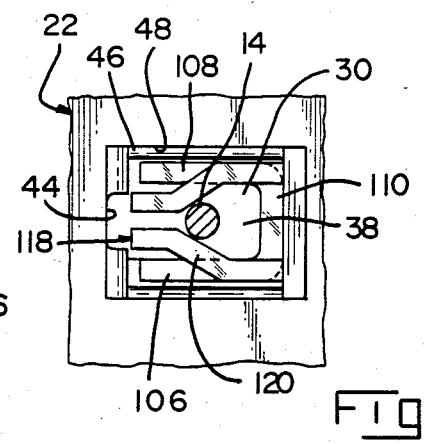
Figure 6:
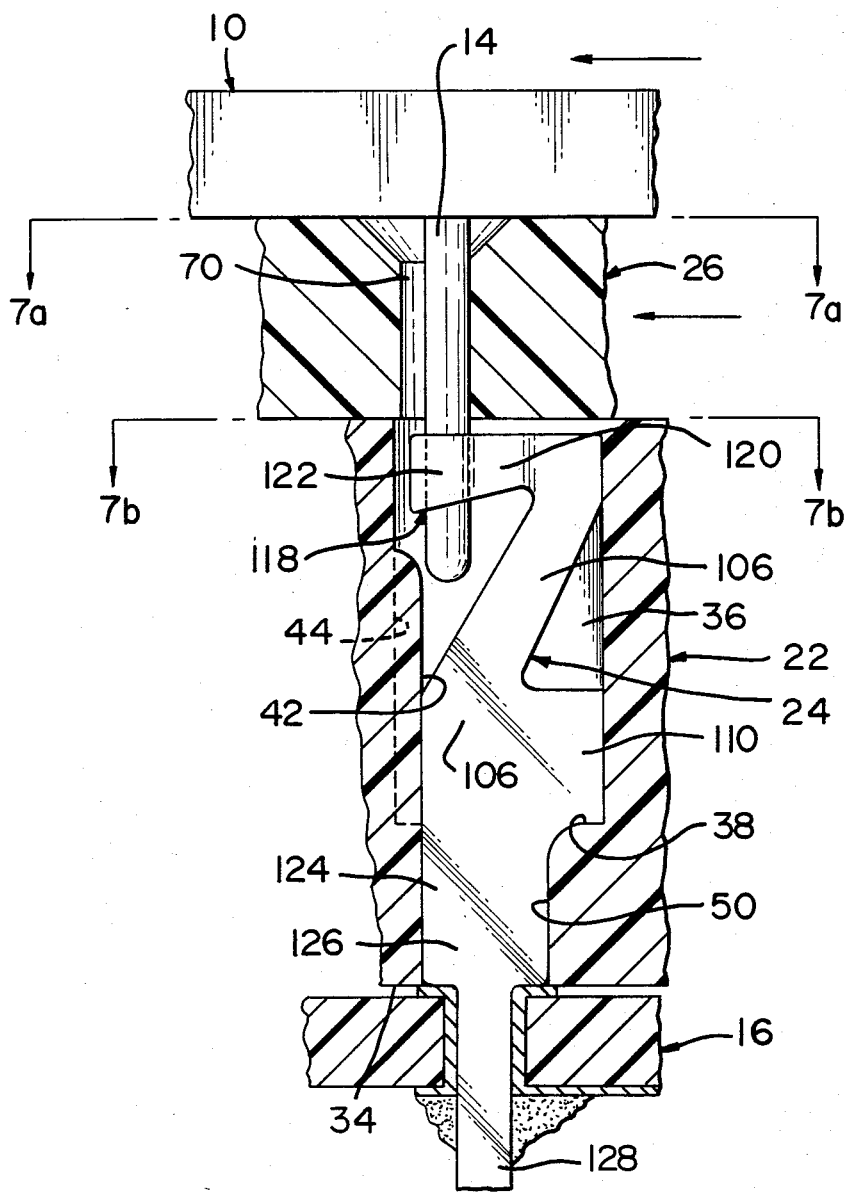
Figures 7A, 7B:
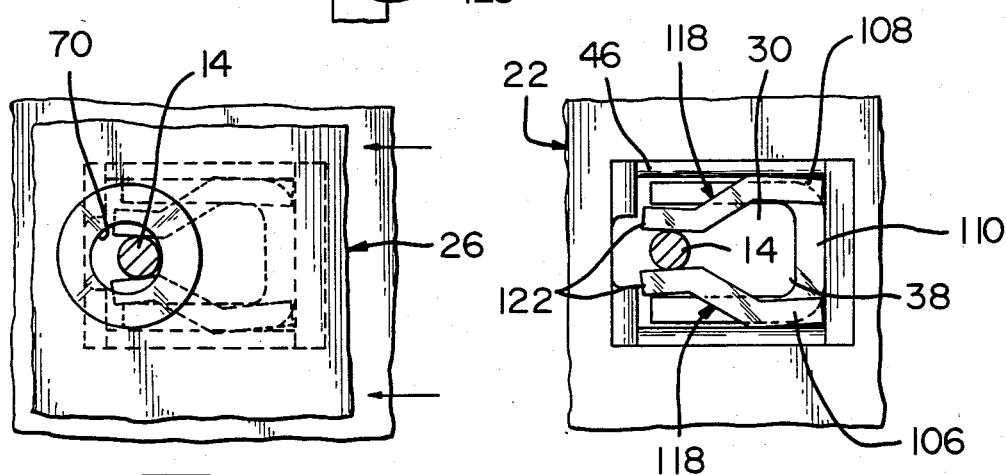

FIGS. 5a and 5b are plan views taken along lines 5a and 5b in FIG. 4;

FIG. 6 is a FIG. 4 view but with the substrate and pin moved laterally by the connector cover so that the pin is now located between the free ends of fingers on the contact element for electrical connection therewith; and FIGS. 7a and 7b are plan views taken along lines 7a and 7b in FIG. 6.

The invention disclosed herein is a connector which is mounted on a printed circuit board or the like and on which an electronic device can be mounted, and through which electrical paths are provided to establish links between the electronic components within the device and the circuitry on the board. The electronic device used to demonstrate the utility of the present invention is a pin grid substrate; the inventive connector, however, is not limited to such a device but rather can be used with any other electronic device having pins or leads with but minor changes relating to dimensions and not to changes in the inventive concepts. Accordingly, wherever the term "pin" is used, it is to be understood that "lead" or other like term may be substituted.

Referring now to FIG. 1, pin grid substrate 10 includes a ceramic member 12 from which pins 14 depend. Circuit board 16, located at the bottom of the drawing, contains circuitry connected to plated through holes 18. The connector of the present invention, indicated generally by reference numeral 20 and shown in exploded fashion between substrate 10 and board 16, provides the electrical links between the pins on the substrate and circuitry on the board.

Connector 20 includes housing 22, contact elements 24, cover 26, and lever 28.

Housing 22, molded from a glass filled nylon sold by General Electric Co. under the tradename VALOX 420, carries a number of regularly spaced cavities 30 extending vertically from top surface 32 through underside 34. The cavity structure is clearly shown in FIG. 4 to which attention is now directed.

Upper section 36 of the cavity extends from top surface 32 down to a floor 38. The distance between the rear wall 40 and front wall 42 decreases about one-third of the way down from the top surface. A vertical groove 44 is provided in the inwardly projecting portion of the front wall.

Upwardly facing shoulders 46 (FIG. 5b) are provided on both side walls 48 a short distance above floor 38.

Lower section 50 of a cavity 30 is dimensionally of reduced cross-sectional area and length relative to the upper section and extends downwardly from one side of the upper section.

With reference to FIG. 1 again, an upwardly opened, lever-receiving groove 54 is provided adjacent end 56 of housing 22. An enlarged portion 58 of the groove, intermediate the ends thereof, accommodates the offset or jog in lever 28. Groove 54 is open at one end 60 to accommodate lever 28.

End wall 56 is notched as indicated by reference numeral 62 to provide room for a depending structure on cover 26.

Two blocks 64 with holes 66 therethrough are located on each side of housing 22. The holes receive roll pins 68. The blocks, holes, and roll pins cooperate with structures on the cover to hold the cover on housing 22.

Cover 26, preferably molded with the same material as the housing, contains vertical openings 70 therethrough in the same number and on the same spacing as cavities 30 in the housing. As shown in FIGS. 4 and 6, the openings adjacent the covers top surface 72 may be funneled to facilitate pin entry.

Cam block 74 extends down below the underside surface 76 of the cover and is channeled along its downwardly facing surface as indicated by reference numeral 78. The cam block lies along end 80 of the cover.

One corner of the cover adjacent end 80 is recessed as indicated by reference numeral 82 to provide room for lever 28.

A block 84 extends downwardly from opposing sides 86 and 88 of the cover. Both blocks are outwardly displaced relative to the vertical plane of the sides. Further, the block on side 86 is displaced downwardly, relative to top surface 72, to provide a space for the arm of lever 28. Each block contains an aperture 90 in each end face to receive roll pin 68.

An L-shaped, short member 92 is located adjacent side 86 and towards end 94 of the cover. One section of the member extends outwardly from that side.

Lever 28, a one piece member, includes handle 96 and cam section 98 which is perpendicular to the handle. A short connecting piece 100 joins the handle and cam section and displaces one relative to the other. The cam section includes jog 102 positioned between axles 104.

A contact element 24 is shown enlarged in FIG. 2 to which reference will now be made.

An element includes two parallel, vertical arms 106 and 108. Channel-shaped strap 110, which joins the two arms adjacent their lower ends 112 and spaces them apart, also provides a downwardly facing surface 114.

The width of arms 106 and 108 decrease uniformly upwardly towards their upper ends 116. Accordingly, the upper portions are susceptible to being twisted about a vertical axis (not shown).

A pair of fingers 118 project laterally from their attachment to upper ends 116 of arms 106 and 108. A first section 120 of the fingers converge towards each other in a direction away from the arms. The free ends 122, attached to and extending outwardly from the converging sections 120, are parallel to one another and are spaced apart by a distance less than the minimum diameter of pins 14 on substrate 12 (or thickness of a lead not shown). The arms and fingers define a shape much like the numeral seven.

Lead 124 extends downwardly from arm 106. The lead includes an upper section 126 and a narrower lower section 128.

The preferred way of making contact elements 24 is by stamping them out of coplanar stock in a continuous strip. FIG. 3 shows one element, attached to carrier strip 130, stamped but not yet formed into the FIG. 2 structure. The several parts are identically numbered for cross-reference to the formed element. The dashed line, where the element will be severed from the carrier strip, is indicated by reference numeral 132.

A suitable material for contact elements 14 is copper alloy with suitable plating; e.g., tin lead over nickel.

Contact elements 24 are positioned in cavities 30 as shown in FIG. 4. The arms 106 and 108 and fingers 118 occupy upper section 36 with fingers 118 being in the longer portion of that section. Downwardly facing surface 114 on strap 110 and lower ends 112 on the arms rests on floor 38. The lower portion of the arms and strap 110 fit in the lower portion of upper section 36 with substantially no movement. Upper section 126 of lead 124 occupies lower section 50 of the cavity and lower section 128 extends down from housing 22 for insertion into plated through hole 18 in board 16.

After loading contact elements 24 into cavities 30, lever 28 is placed into the housing with jog 102 positioned in enlarged portion 58 of groove 54 and axles 104 in the narrower sections of the groove on either side of portion 58. The connecting piece 100 and handle 96 extend out of the groove through open end 60.

Cover 26 is placed onto top surface 32 so that blocks 84 slide in between blocks 64 and block 74 enters into enlarged portion 58—notch 62. Jog 102 is received into channel 78 in block 74. The cover is slidably attached to housing 22 by sliding roll pins 68 into holes 66 in blocks 64 and apertures 90 in blocks 84.

The cover is moved back and forth on top surface 32 by pivoting handle 96. As is well understood, jog 102 moves in an arc and, being confined in channel 78, moves the cover. The degree of offset of jog 102 limits the amount of travel imparted to the cover by lever 28. Blocks 64, between which cover blocks 84 move on roll pins 68, define the covers total travel in the horizontal direction.

FIG. 4 is a cross-sectional view showing connector 20 with substrate 10 mounted thereon. The cover 26 is positioned so that pin 14 passes through opening 70 and in between arms 106–108 and sections 120 on fingers 118. With these sections of the contact element being spaced apart a distance greater than the pin diameter, there is no resistance in inserting the pin.

FIG. 5a is a view from the top of cover 26 showing the pin positioned as described above. This view, and FIG. 5b, a view from the top of housing 22, clearly shows pin 14 may be inserted into connector 20 with zero insertion force when cover 26 is in a first position. The view also shows that the free ends 122 of fingers 118 are in a normally closed position which is a non-stressed condition.

By means of lever 28, cover 26 and substrate 10 mounted thereon are moved across the top surface 32 of housing 22. The arrows in FIGS. 6 and 7a indicate the direction of travel. As the cover moves, the wall defining opening 70 engages pin 14 and moves it in between free ends 122 on fingers 118. FIG. 6 is a side elevation, cross-sectional view showing the pin so positioned. As the pin is pushed through converging first sections 120 and into free ends 122, the fingers are spread apart thereby in that the pin diameter is greater than the space between the free ends. Further, arms 106 and 108 are twisted about a vertical axis. Accordingly, considerable compressive and torsional forces keeps free ends 122 bearing hard against pin 14 to achieve and maintain good electrical contact therebetween. The facing surfaces of free ends 122 may be plated with a noble metal to further enhance the electrical contact; e.g., gold over nickel.

FIGS. 7a and 7b are top plan views showing the FIG. 6 condition. FIG. 7b particularly shows arms 106 and 108 being twisted as well as free ends 122 spread apart by pin 14 being pushed in between them.

FIG. 6 shows that the purpose of vertical groove 44 is to ensure the lower end of pin 14 has room and is not impeded by wall 42.

Lever 28 is designed so that with cover 26 being moved from a FIG. 4 first position to a FIG. 6 second position, handle 96 lies along the top of block 84 on cover side 86 and is removably latched in under the overhang on member 92 (enough resiliency is available both in the handle and member 92 to allow the handle to pass in under the overhang).

It should be apparent that the connector of the present invention can be modified to accept substantially any electronic device having pins or leads extending therefrom. The modifications need only be relative to dimensions, number of required cavities and the like. No changes to the inventive concepts are necessary.

We claim:

1. An electrical connector comprising a housing in which a plurality of contact elements are positioned, said elements having a pair of generally converging, horizontal fingers in between which a pin from an electronic device is laterally inserted, characterized in that the fingers are attached to upper ends of vertically extending, parallel arms such that each arm and attached finger define a figure seven shape, the arms being attached at their lower ends to a channel-shaped strap and being of sufficient length such that, upon laterally inserting a pin in between the fingers and thereby spreading them apart, the arms are twisted about their vertical axis to exert a torsional force against the inserted pin.

2. An electrical connector according to claim 1 characterized in that the width of the vertically extending arms decrease upwardly towards the upper ends.

* * * * *